(12) United States Patent
Chen et al.

(10) Patent No.: US 11,086,452 B2
(45) Date of Patent: Aug. 10, 2021

(54) PIXEL ARRAY SUBSTRATE

(71) Applicant: Au Optronics Corporation, Hsinchu (TW)

(72) Inventors: Ming-Yao Chen, Hsinchu (TW); Shu-Wen Tzeng, Hsinchu (TW); Jui-Chi Lo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/917,932

(22) Filed: Jul. 1, 2020

(65) Prior Publication Data

US 2021/0157441 A1 May 27, 2021

Related U.S. Application Data

(60) Provisional application No. 62/941,248, filed on Nov. 27, 2019.

(30) Foreign Application Priority Data

Mar. 12, 2020 (TW) .................................. 109108094

(51) Int. Cl.
*G06F 3/041* (2006.01)
*G06F 3/042* (2006.01)
*H01L 27/32* (2006.01)

(52) U.S. Cl.
CPC .......... *G06F 3/0421* (2013.01); *H01L 27/323* (2013.01); *H01L 27/3258* (2013.01); *H01L 27/3272* (2013.01); *H01L 27/3276* (2013.01)

(58) Field of Classification Search
CPC ... G06F 3/0412; G06F 3/042; G09G 2300/08; G09G 2300/0842; G09G 2300/0852; G09G 2360/148; G09G 3/20; G09G 3/3233; G09G 3/3648

See application file for complete search history.

(56) References Cited

U.S. PATENT DOCUMENTS

2007/0205999 A1    9/2007  Akimoto et al.
2013/0021298 A1*   1/2013  Seo ...................... G06F 3/0412
                                                 345/175
2014/0184570 A1*   7/2014  Ahn ........................ G06F 3/044
                                                 345/175

FOREIGN PATENT DOCUMENTS

CN      101034236      9/2007
CN      101706621      5/2010
CN      108596083      9/2018
(Continued)

*Primary Examiner* — Insa Sadio
(74) *Attorney, Agent, or Firm* — JCIPRNET

(57) ABSTRACT

A pixel array substrate including a substrate, a plurality of first signal lines, a plurality of pixel structures, a plurality of second signal lines, a plurality of light sensing units, a plurality of third signal lines, and a plurality of touch units is provided. The first signal lines are arranged on the substrate along a first direction. The pixel structures are disposed between the first signal lines. The second signal lines are arranged on the substrate along the first direction. The light sensing units are disposed between the second signal lines. Any adjacent two of the light sensing units are electrically connected to one of the second signal lines and are symmetrically disposed with respect to the second signal line. The third signal lines and the second signal lines are alternately arranged on the substrate. The touch units are electrically connected to the third signal lines.

20 Claims, 7 Drawing Sheets

(56) References Cited

FOREIGN PATENT DOCUMENTS

| CN | 109254683 | 1/2019 |
|----|-----------|--------|
| CN | 110058735 | 7/2019 |

* cited by examiner

PIXEL ARRAY SUBSTRATE

CROSS-REFERENCE TO RELATED APPLICATION

This application claims the priority benefit of U.S. provisional application Ser. No. 62/941,248, filed on Nov. 27, 2019, and Taiwan application serial no. 109108094, filed on Mar. 12, 2020. The entirety of each of the above-mentioned patent applications is hereby incorporated by reference herein and made a part of this specification.

BACKGROUND

Technical Field

The disclosure relates to a circuit substrate, and in particular relates to a pixel array substrate having display, touch, and optical sensing functions.

Description of Related Art

Nowadays, fingerprint identification is widely applied to various electronic products, and is most commonly seen in portable mobile devices such as smartphones and tablet computers. Meanwhile, in a pursuit of a better visual experience, display screens of current electronic products are gradually developing towards a direction of a high screen-to-body ratio and a narrow bezel. Fingerprint identification modules therefore need to be disposed under the display screen instead, and a technology of fingerprint on display has thus been developed.

In order to simplify the manufacturing process of such touch display panels having a fingerprint on display function, a touch display technology which integrates a fingerprint identification module and a touch sensing module into a pixel array substrate is proposed. In order to maximize aperture ratios of display pixels, circuit traces configured to transmit fingerprint identification signals and touch sensing signals must overlap display signal lines. Accordingly, additional film layers are inevitable to provide sufficient layout space for circuit configuration, which results in increased production costs.

SUMMARY

The disclosure provides a pixel array substrate which has a relatively large layout space available for circuit configuration.

The disclosure provides a pixel array substrate which can simplify the manufacturing process.

A pixel array substrate of the disclosure includes a substrate, a plurality of first signal lines, a plurality of pixel structures, a plurality of second signal lines, a plurality of light sensing units, a plurality of third signal lines, and a plurality of touch units. The plurality of first signal lines are arranged on the substrate along a first direction. The plurality of the pixel structures are disposed between the first signal lines and electrically connected to the first signal lines. The plurality of second signal lines are arranged on the substrate along the first direction. The plurality of light sensing units are disposed between the second signal lines, and are electrically connected to the second signal lines. Any adjacent two of the light sensing units are symmetrically disposed with respect to one of the second signal lines. The plurality of third signal lines and the second signal lines are alternately arranged on the substrate. The plurality of touch units are electrically connected to the third signal lines.

A pixel array substrate of the disclosure includes a substrate, a plurality of first signal lines, a plurality of pixel structures, a plurality of second signal lines, a plurality of light sensing units, a plurality of third signal lines, and a plurality of touch units. The plurality of first signal lines are arranged on the substrate along a first direction. The plurality of the pixel structures are disposed between the first signal lines. The plurality of second signal lines are arranged on the substrate along the first direction. The plurality of light sensing units are disposed between the second signal lines, and any adjacent two of the light sensing units are electrically connected to one of the second signal lines. The plurality of third signal lines and the second signal lines are alternately arranged on the substrate. The plurality of touch units are electrically connected to the third signal lines.

Based on the foregoing, in a pixel array substrate according to an embodiment of the disclosure, a plurality of pixel structures and a plurality of first signal lines which are configured for displaying are alternately arranged on a substrate along a direction. The light sensing units and a plurality of second signal lines which are configured for optical sensing are also alternately arranged on the substrate along the direction. Through symmetrically disposing any adjacent two of the light sensing units with respect to one of the second signal lines, and electrically connecting the same, a layout space available for circuit configuration can be increased, which facilitates simplification of the manufacturing process of the pixel array substrate and reduction of production costs thereof.

DESCRIPTION OF THE EMBODIMENTS

Figure 1:
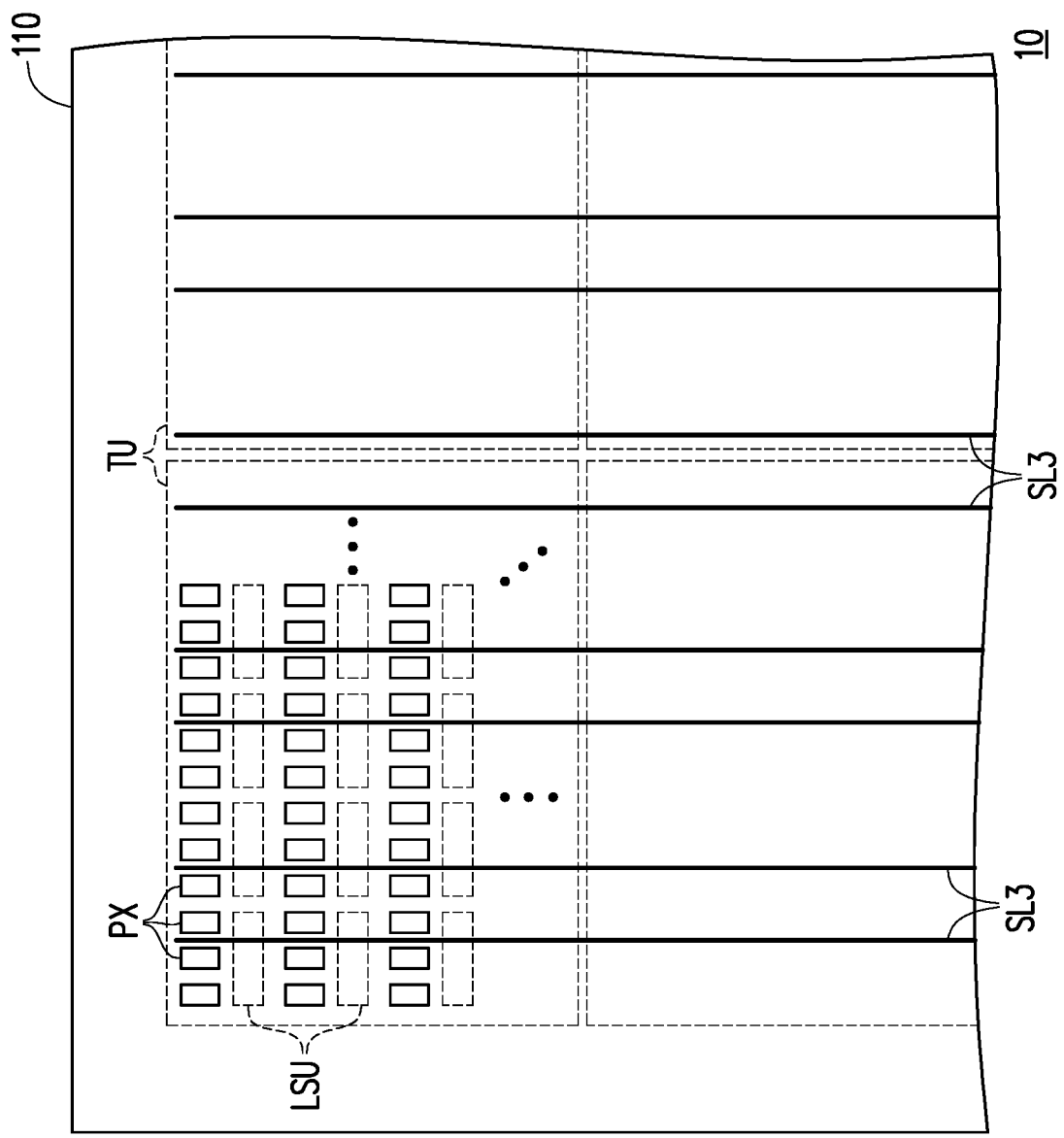
FIG. 1 is a schematic top view of a pixel array substrate according to an embodiment of the disclosure.
Figure 1:
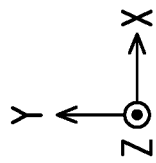

The term "about", "similar", "essentially", or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For instance, "about" may mean within one or more standard deviations, or, for instance, ±30%, ±20%, ±10%, or ±5% of the stated value. Furthermore, a relatively acceptable range of deviation or standard deviation may be chosen for the term "about", "approximately", "essentially", or "substantially" as used herein based on measurement properties, cutting properties, or other properties, instead of applying one standard deviation across all the properties.

In the drawings, thicknesses of layers, films, panels, regions, etc., are exaggerated for the sake of clarity. It should be understood that when a device such as a layer, film, region, or substrate is referred to as being "on", or "connected to" another device, it may be directly on or connected to another device, or intervening devices may also be present. In contrast, when a device is referred to as being "directly on" or "directly connected to" another device, no intermediate devices are present. As used herein, the term "connected" may refer to physical connection and/or electrical connection. Furthermore, "electrically connected" may encompass the presence of other devices between two devices.

Moreover, relative terms such as "lower" or "bottom" and "upper" or "top" may serve to describe the relation between one component and another component herein as shown in the drawings. It should also be understood that the relative terms are intended to include different orientations of a device in addition to the orientation shown in the drawings. For instance, if a device in the drawings is turned upside down, a component described as being on the "lower" side of other components shall be re-orientated to be on "upper" sides of the other components. Thus, the exemplary term "lower" may include the orientations of "lower" and "upper", depending on the specific orientation of the drawings. Similarly, if a device in the drawings is turned upside down, a component described to be "below" or "beneath" other components shall be re-oriented to be "above" the other components. Therefore, the exemplary term "above" or "below" may include orientations of above and below.

Reference will now be made in detail to exemplary embodiments provided in the disclosure, examples of which are illustrated in the accompanying drawings. Wherever possible, identical reference numerals are used in the drawings and descriptions to refer to identical or similar parts.

Figure 2:
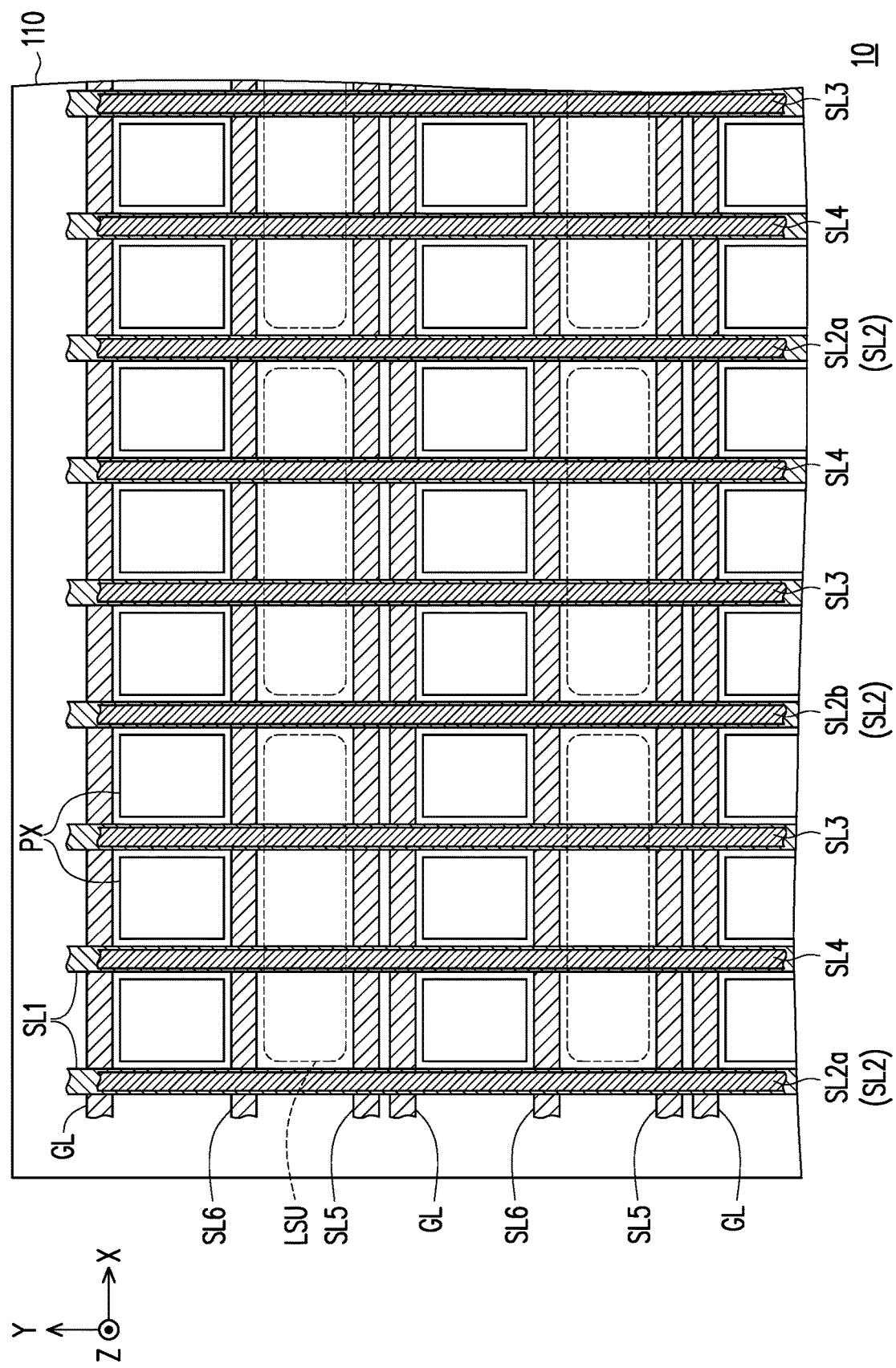
FIG. 2 is an enlarged schematic view of a partial area of the pixel array substrate of FIG. 1.
Figure 3:
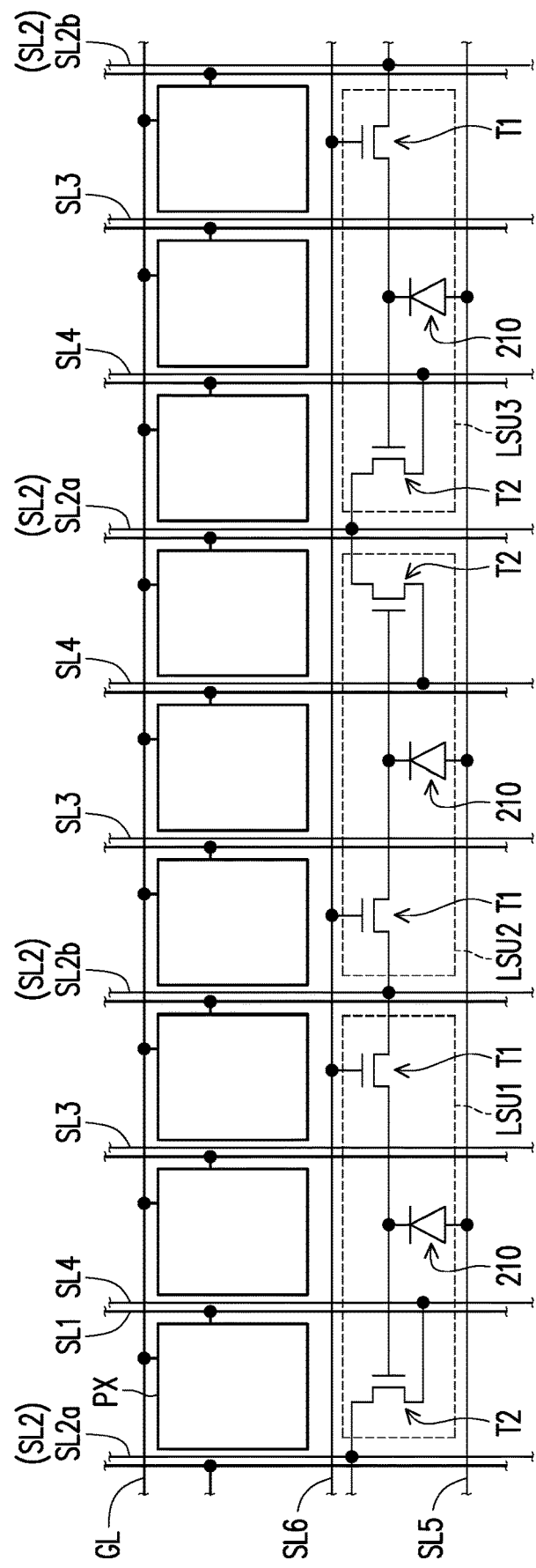
FIG. 3 is a circuit diagram of the pixel array substrate of FIG. 2.
Figure 4:
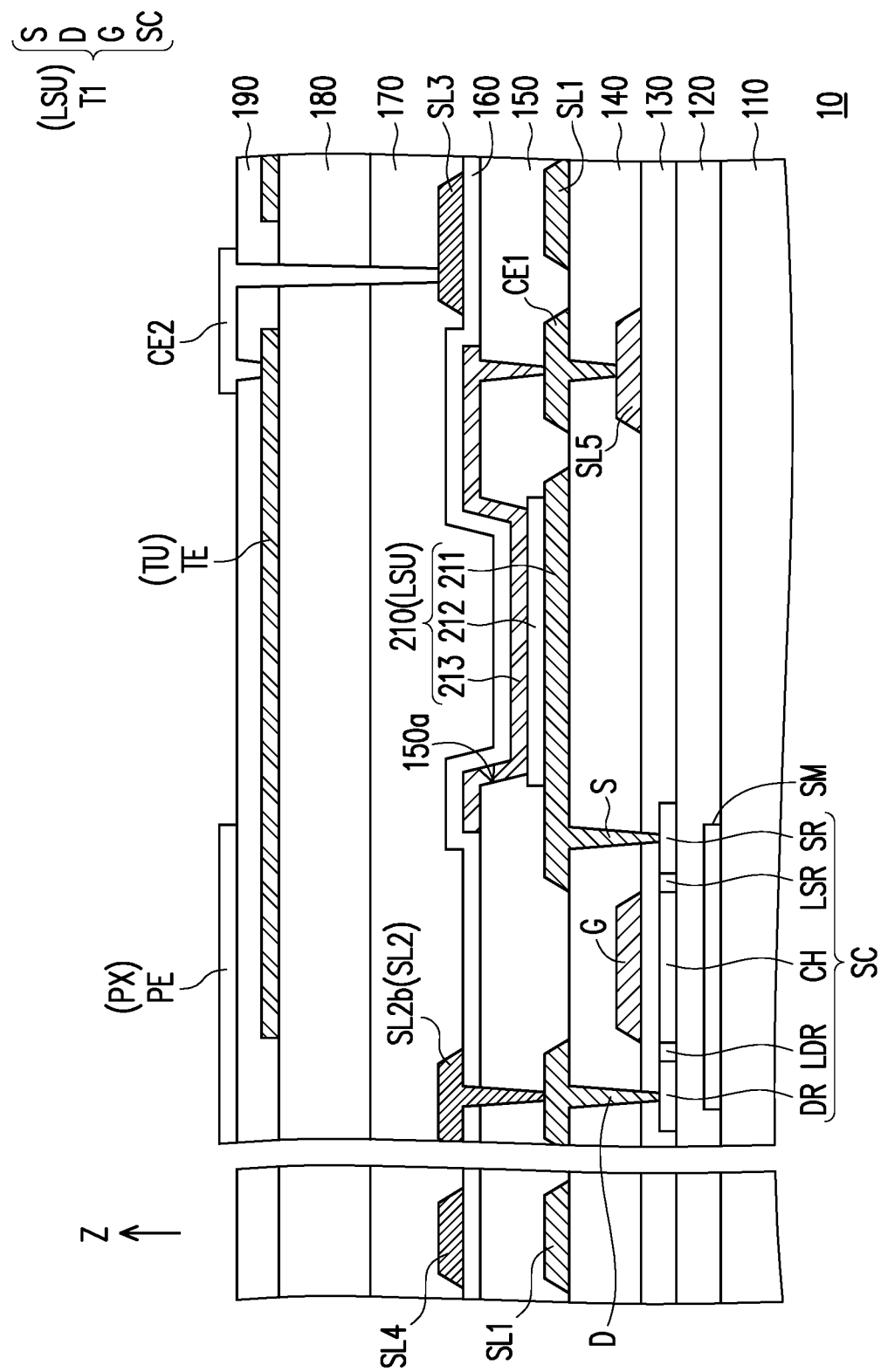
FIG. 4 is a schematic cross-sectional view of the pixel array substrate of FIG. 2.

FIG. 1 is a schematic top view of a pixel array substrate according to an embodiment of the disclosure. FIG. 2 is an enlarged schematic view of a partial area of the pixel array substrate of FIG. 1. FIG. 3 is a circuit diagram of the pixel array substrate of FIG. 2. FIG. 4 is a schematic cross-sectional view of the pixel array substrate of FIG. 2. Particularly, for the sake of clarity, FIG. 1 omits illustrations of scan lines GL, first signal lines SL1, second signal lines SL2, fourth signal lines SL4, fifth signal lines SL5, and sixth signal lines SL6 shown in FIG. 2. In addition, FIG. 2 omits illustrations of a buffer layer 120, a gate insulating layer 130, an interlayer insulating layer 140, a first planarization layer 150, an insulating layer 160, a second planarization layer 170, an insulating layer 180, an insulating layer 190, a touch electrode TE, a first active device T1, a sensor 210, a connection electrode CE1, a connection electrode CE2 and a connection electrode CE3 shown in FIG. 4.

Referring to FIG. 1, FIG. 2, and FIG. 3, the pixel array substrate 10 includes the substrate 110, a plurality of scan lines GL, a plurality of first signal lines SL1 (e.g., data lines), and a plurality of pixel structures PX. For instance, the scan lines GL are arranged on the substrate 110 along a direction Y and extend in a direction X. The first signal lines SL1 are arranged on the substrate 110 along the direction X and extend in the direction Y. The pixel structures PX are separately disposed between the first signal lines SL1. In this embodiment, the direction X may be perpendicular to the direction Y, but is not limited thereto. More specifically, the pixel structures PX are in an array arrangement on the substrate 110, and each electrically connected to a corresponding one of the scan lines GL and a corresponding one of the first signal lines SL1.

Particularly, the pixel array substrate 10 of this embodiment is suitable for a full-screen display panel which has fingerprint on display, touch sensing, and display functions at the same time. Besides, the full-screen display panel as such is adapted to be mounted on a portable electronic device (e.g., a smartphone, a tablet computer, or a smartwatch). The full-screen display panel is, for instance, a non-self-luminous display panel. For instance, the full-screen display panel may include the pixel array substrate 10, a display medium layer, and an opposite substrate, and the display medium layer is sandwiched between the pixel array substrate 10 and the opposite substrate and includes a plurality of liquid crystal molecules. In other words, the full-screen display panel mentioned herein is a liquid crystal display panel. It should be understandable that the full-screen display panel as such needs to work with a backlight module to achieve the effect of displaying. However, the disclosure is not limited thereto. According to other embodiments, the full-screen display panel may also be a self-luminous display panel. That is, the display medium layer may include a plurality of light-emitting diode elements. The light-emitting diode elements may, for instance, be organic light-emitting diodes, micro light-emitting diodes, or mini light-emitting diodes.

Furthermore, the pixel array substrate 10 further includes a plurality of second signal lines SL2 and a plurality of light sensing units LSU. The second signal lines SL2 are arranged on the substrate 110 along the direction X and extend in the direction Y. The light sensing units LSU are separately disposed between the second signal lines SL2, and electrically connected to the second signal lines SL2. In this embodiment, the second signal lines SL2 include a plurality of second signal lines SL2a and a plurality of second signal lines SL2b, and the second signal lines SL2a and the second signal lines SL2b are alternately arranged on the substrate 110. More specifically, one second signal line SL2a and one second signal line SL2b are respectively provided between one light sensing unit LSU and two other light sensing units LSU adjacently provided on two opposite sides the one light sensing unit LSU.

For instance, the plurality of light sensing units LSU include a first light sensing unit LSU1, a second light sensing unit LSU2, and a third light sensing unit LSU3 adjacent to each other and arranged along the direction X. One second signal line SL2b is provided between the first light sensing unit LSU1 and the second light sensing unit LSU2, and one second signal line SL2a is provided between the second light sensing unit LSU2 and the third light sensing unit LSU3. In this embodiment, the light sensing unit LSU includes a sensor 210, a first active device T1, and a second active device T2, but is not limited thereto. The first active device T1 is electrically connected to and between the sensor 210 and the second signal line SL2b, and the second active device T2 is electrically connected to and between the sensor 210 and the second signal line SL2a. In this embodiment, the second signal lines SL2a may, for instance, be high potential side power supply lines (SVDD), and the second signal lines SL2b may, for instance, be low potential side power supply lines (SVSS), but the disclosure is not limited thereto.

Notably, any adjacent two of the light sensing units LSU are symmetrically disposed with respect to one of the second signal lines SL2. For instance, the first light sensing unit LSU1 and the second light sensing unit LSU2 are symmetrically disposed with respect to the second signal line SL2*b*. More specifically, the first active device T1, the sensor 210, and the second active device T2 of the first light sensing unit LSU1, and the first active device T1, the sensor 210, and the second active device T2 of the second light sensing unit LSU2 are sequentially disposed in a direction away from the same one second signal line SL2*b* (i.e., the second signal line SL2*b* between the first light sensing unit LSU1 and the second light sensing unit LSU2). Similarly, the second light sensing unit LSU2 and the third light sensing unit LSU3 are symmetrically disposed with respect to the second signal line SL2*a*. More specifically, the second active device T2, the sensor 210, and the first active device T1 of the second light sensing units LSU2, and the second active device T2, the sensor 210, and the first active device T1 of the third light sensing unit LSU3 are sequentially disposed in a direction away from the same one second signal line SL2*a* (i.e., the second signal line SL2*a* between the second light sensing unit LSU2 and the third light sensing unit LSU3).

From another viewpoint, any adjacent two of the light sensing units LSU are electrically connected to one of the second signal lines SL2. For instance, the first active device T1 of the first light sensing unit LSU1 and the first active device T1 of the second light sensing unit LSU2 are electrically connected to the second signal line SL2*b* provided between the first light sensing unit LSU1 and the second light sensing unit LSU2. Similarly, the second active device T2 of the second light sensing unit LSU2 and the second active device T2 of the third light sensing unit LSU3 are electrically connected to the second signal line SL2*a* provided between the second light sensing unit LSU2 and the third light sensing unit LSU3. That is to say, the first light sensing unit LSU1 and the second light sensing unit LSU2 may share one common second signal line SL2*b*, and the second light sensing unit LSU2 and the third light sensing unit LSU3 may share one common second signal lines SL2. Accordingly, a layout space available for circuit configuration of the pixel array substrate 10 can thus be increased.

Furthermore, the pixel array substrate 10 further includes a plurality of third signal lines SL3 and a plurality of touch units TU. The third signal lines SL3 are arranged along the direction X and extend in the direction Y. The third signal lines SL3 and the second signal lines SL2 are alternately arranged on the substrate 110. The plurality of touch units TU are electrically connected to the third signal lines SL3. In this embodiment, the plurality of touch units TU may be arranged into a plurality of columns and a plurality of rows respectively in the direction X and in the direction Y. A vertical projection of an area occupied by each of the touch units TU on the substrate 110 may overlap vertical projections of areas occupied by the plurality of pixel structures PX and the plurality of light sensing units LSU on the substrate 110. For instance, the third signal lines SL3 may be touch sensing signal lines, but are not limited thereto.

In this embodiment, the pixel array substrate 10 may further include a plurality of fourth signal lines SL4, a plurality of fifth signal lines SL5, and a plurality of sixth signal lines SL6. The plurality of fourth signal lines SL4 are arranged along the direction X and extend in the direction Y. The fourth signal lines SL4 and the second signal lines SL2 are alternately arranged on the substrate 110. The plurality of fifth signal lines SL5 and the plurality of sixth signal lines SL6 are arranged along the direction Y and extend in the direction X. The fifth signal lines SL5, the sixth signal lines SL6, and the scan lines GL are alternately arranged on the substrate 110. For instance, the second active device T2 of the light sensing unit LSU is electrically connected to and between the fourth signal line SL4 and the second signal line SL2*a*. The plurality of sensors 210 of the plurality of light sensing units LSU arranged along the direction X are electrically connected to the same one fifth signal line SL5. The plurality of first active devices T1 of the plurality of light sensing units LSU arranged along the direction X are electrically connected to the same one sixth signal line SL6. In this embodiment, the fourth signal lines SL4 may be configured to transmit a DC voltage signal to an external driving chip (not shown), the fifth signal lines SL5 may be configured to transmit a pulse voltage signal, and the sixth signal lines SL6 may, for instance, be reset signal lines. Nonetheless, the disclosure is not limited thereto.

Referring to FIG. 4, the pixel array substrate 10 further includes a buffer layer 120. In this embodiment, a method for forming an active device (e.g., the first active device T1) may include the following steps. A semiconductor pattern SC, a gate insulating layer 130, a gate G, an interlayer insulating layer 140, a source S, and a drain D are sequentially formed on the buffer layer 120. The semiconductor pattern SC has a source region SR, a lightly doped source region LSR, a channel region CH, a lightly doped drain region LDR, and a drain region DR. The gate G overlaps the channel region CH of the semiconductor pattern SC in a normal direction of the substrate 110 (e.g., direction Z). The source S and the drain D penetrate through the interlayer insulating layer 140 and the gate insulating layer 130 to be electrically connected to the source region SR and the drain region DR of the semiconductor pattern SC, respectively.

In this embodiment, the gate G of the active device (e.g., the first active device T1) may be optionally disposed above the semiconductor pattern SC (i.e., the gate G, the source S, and the drain D are located on a same side of the semiconductor pattern SC), to form a top-gate thin-film transistor. Nonetheless, the disclosure is not limited thereto. In other embodiments, the gate G of the active device may be optionally disposed below the semiconductor pattern SC (i.e., the gate G is provided between the semiconductor pattern SC and the substrate 110) to form a bottom-gate thin-film transistor.

It is worth mentioning that the gate G, the source S, the drain D, the semiconductor pattern SC, the buffer layer 120, the gate insulating layer 130, and the interlayer insulating layer 140 may be realized by any gate, any source, any drain, any semiconductor pattern, any buffer layer, any gate insulating layer, and any interlayer insulating layer used for a pixel array substrate well-known to any person having ordinary skill in the art. Also, the gate G, the source S, the drain D, the semiconductor pattern SC, the buffer layer 120, the gate insulating layer 130, and the interlayer insulating layer 140 may be formed by any method well-known to any person having ordinary skill in the art, so will not be repeatedly described herein.

In this embodiment, the pixel array substrate 10 may also optionally include at least one light-shielding pattern SM. The light-shielding pattern SM is disposed between the buffer layer 120 and the substrate 110, and overlaps the active device (e.g., the first active device T1) in the direction Z to prevent electrical properties of the semiconductor pattern SC from deterioration due to long-time exposure to backlights. On the other hand, in this embodiment, materials of the fifth signal lines SL5, the sixth signal lines SL6 (as shown in FIG. 2), and the scan lines GL may also be optionally the same. Namely, the fifth signal lines SL5, the sixth signal lines SL6, and the scan lines GL may belong to a same film layer, and the film layer is provided between the gate insulating layer 130 and the interlayer insulating layer 140, but the disclosure is not limited thereto.

Furthermore, in this embodiment, a method of forming the sensor 210 may include the following steps. A first electrode 211, a sensing layer 212, a first planarization layer 150, and a second electrode 213 are sequentially formed on the interlayer insulating layer 140. The sensing layer 212 is sandwiched between the first electrode 211 and the second electrode 213. The first planarization layer 150 covers the active device, and has an opening 150a overlapping the sensing layer 212. The second electrode 213 of the sensor 210 extends to the inside of the opening 150a to cover a portion of the sensing layer 212 exposed through the opening 150a.

For instance, the first electrode 211 of the sensor 210 is electrically connected to the source S of the first active device T1, and the second electrode 213 of the sensor 210 is electrically connected to the fifth signal line SL5. In this embodiment, the second electrode 213 of the sensor 210 is electrically connected to the fifth signal line SL5 through a connection electrode CE1. Notably, in this embodiment, the first signal lines SL1, the connection electrode CE1, the first electrode 211 of the sensor 210, the source S and the drain D of the active device may belong to a same film layer (i.e., materials of the components may be optionally the same). However, the disclosure is not limited thereto.

In this embodiment, a material of the sensing layer 212 is, for instance, a silicon-rich oxide or other suitable materials. The first electrode 211 is, for instance, a reflective electrode. Materials of the reflective electrode includes metals, alloys, metal nitrides, metal oxides, metal oxynitrides, or other suitable materials, or a stacked layer of metals and other conductive materials. The second electrode 213 is, for instance, a light-transmitting electrode. Materials of the light-transmitting electrode includes metal oxides, for instance, indium tin oxides, indium zinc oxide, aluminum tin oxide, aluminum zinc oxide, or other suitable oxides, or a stacked layer of at least two of the above. However, the disclosure is not limited thereto. According to other embodiments, the first electrode 211 may also be a light-transmitting electrode.

The pixel array substrate 10 further includes an insulating layer 160, a second planarization layer 170, an insulating layer 180, and an insulating layer 190 which are sequentially stacked on the sensor 210. The insulating layer 160 directly covers the first planarization layer 150 and the sensor 210. In this embodiment, the second signal line SL2 (e.g., the second signal lines SL2a and the second signal lines SL2b), the third signal line SL3 and the fourth signal line SL4 may belong to a same film layer (i.e., materials of the components may be optionally the same), and the film layer is provided between the insulating layer 160 and the second planarization layer 170.

Furthermore, a touch electrode TE of the touch unit TU may be disposed between the insulating layer 180 and the insulating layer 190, and may be electrically connected to the third signal line SL3 through a connection electrode CE2. For instance, the pixel structure PX may include at least one active device (not shown) and a pixel electrode PE electrically connected to the active device. The pixel electrode PE may be disposed on the insulating layer 190. In this embodiment, the pixel electrode PE and the connection electrode CE2 may belong to a same film layer. That is to say, materials of the pixel electrode PE and the connection electrode CE2 may be optionally the same, but the disclosure is not limited thereto.

In this embodiment, the plurality of second signal lines SL2, the plurality of third signal lines SL3, and the plurality of fourth signal lines SL4 may overlap the plurality of first signal lines SL1 in the direction Z, as shown in FIG. 2 and FIG. 4, to increase an aperture ratio of the pixel structures PX. Notably, in this embodiment, through symmetrically disposing any adjacent two of the light sensing units LSU with respect to one of the plurality of second signal lines SL2, and electrically connecting any adjacent two of the light sensing units LSU to one of the second signal lines SL2, the pixel array substrate 10 layout space available for circuit configuration can be increased. For instance, the plurality of third signal lines SL3 which are configured for touch sensing, and the plurality of second signal lines SL2 and the plurality of fourth signal lines SL4 which are configured for optical sensing may be formed on a same film layer. In other words, the number of film layers needed can be prevented from increasing, which facilitates reduction of production costs.

It should be noted that, in this embodiment, widths of the second signal lines SL2, the third signal lines SL3, and the fourth signal lines SL4 in the direction X may be less than a width of the first signal lines SL1 in the direction X, but the disclosure is not limited thereto. In other embodiments, the widths of the second signal lines SL2, the third signal lines SL3, and the fourth signal lines SL4 in the direction X may also be equal to the width of the first signal lines SL1 in the direction X. On the other hand, in this embodiment, the second signal lines SL2, the third signal lines SL3, and the fourth signal lines SL4 may completely overlap the plurality of first signal lines SL1, but the disclosure is not limited thereto. In other embodiments, the second signal lines SL2, the third signal lines SL3, and the fourth signal lines SL4 may also partially overlap the plurality of first signal lines SL1.

Hereinafter, other embodiments will be described to explain the disclosure in detail. The same components will be annotated with the same reference numerals, and the description of the same technical content will be omitted. For the omitted part, please refer to the foregoing embodiments, and details will not be repeatedly described herein.

Figure 5:
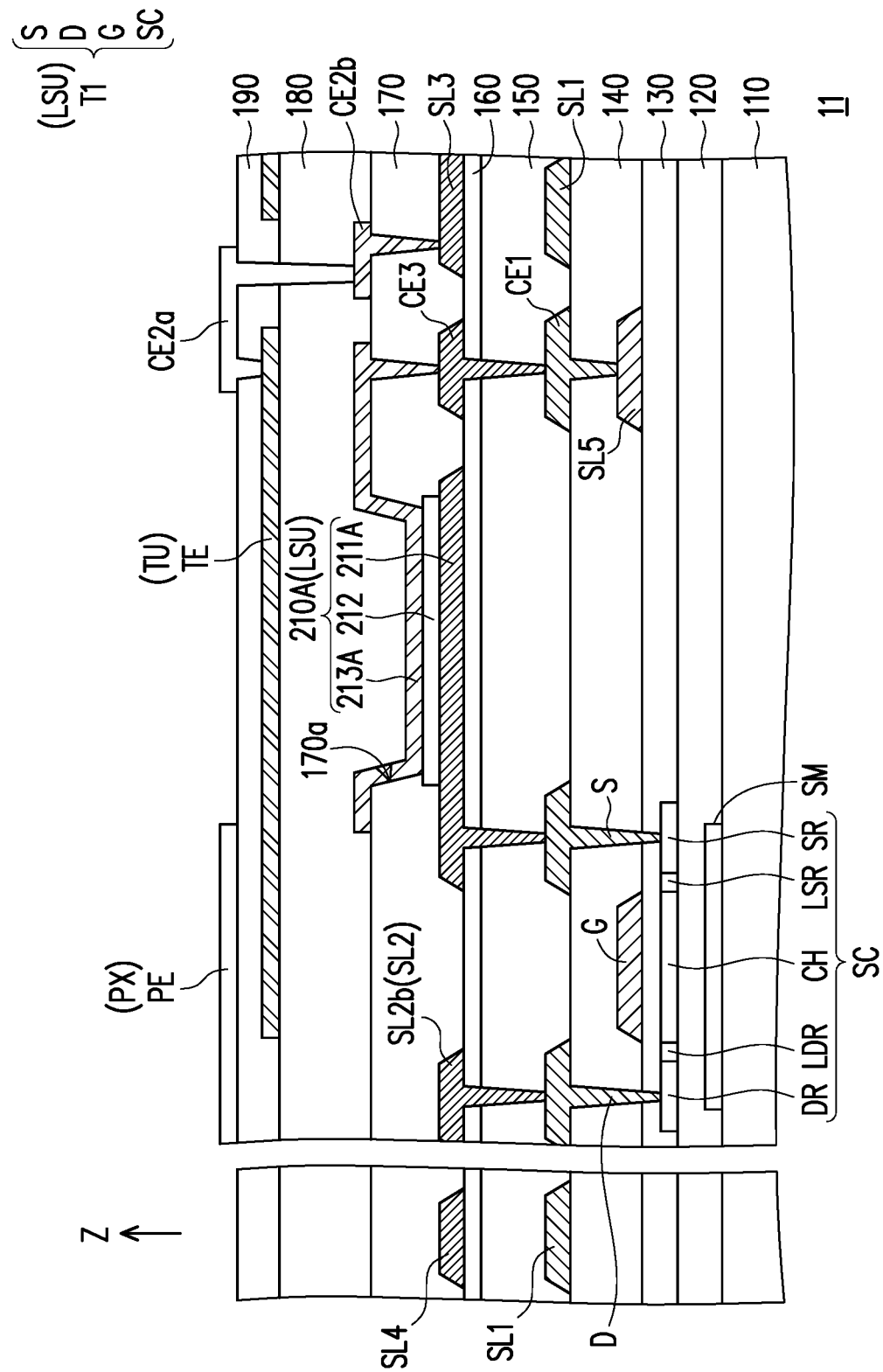
FIG. 5 is a schematic cross-sectional view of a pixel array substrate according to another embodiment of the disclosure.

FIG. 5 is a schematic cross-sectional view of a pixel array substrate according to another embodiment of the disclosure. Referring to FIG. 5, the main difference between a pixel array substrate 11 of this embodiment and the pixel array substrate 10 of FIG. 4 is that the sensor is disposed on a different film layer. Specifically, a sensor 210A of the pixel array substrate 11 is disposed on the insulating layer 160. In this embodiment, a first electrode 211A of the sensor 210A is provided between the second planarization layer 170 and the insulating layer 160, penetrates through the insulating layer 160 and the first planarization layer 150, and is electrically connected to the source S of the first active device T1. The second planarization layer 170 has an opening 170a overlapping the sensing layer 212, and a second electrode 213A extends to the inside of the opening 170a to directly cover the sensing layer 212.

In this embodiment, the second electrode 213A of the sensor 210A is electrically connected to the fifth signal line SL5 through a connection electrode CE3 and the connection electrode CE1. Moreover, the connection electrode CE3, the first electrode 211A of the sensor 210A, the second signal lines SL2, the third signal lines SL3, and the fourth signal lines SL4 may belong to a same film layer. On the other hand, the touch electrode TE of one of the touch units TU is electrically connected to the third signal line SL3 through a connection electrode CE2a and a connection electrode CE2b. Moreover, the connection electrode CE2b and the second electrode 213A of the sensor 210A may belong to the same film layer, but the disclosure is not limited thereto.

Figure 6:
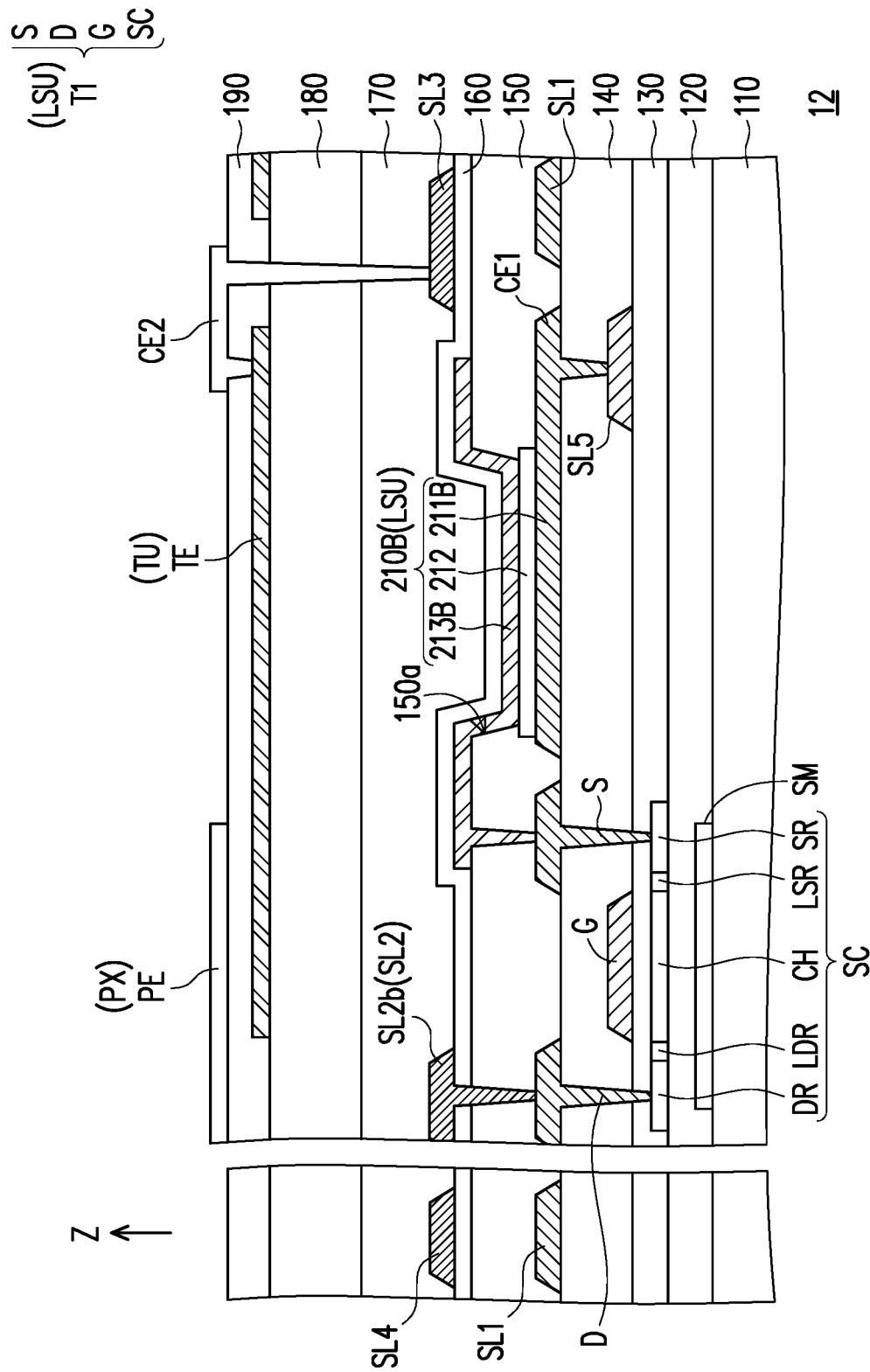
FIG. 6 is a schematic cross-sectional view of a pixel array substrate according to another embodiment of the disclosure.

FIG. 6 is a schematic cross-sectional view of a pixel array substrate according to another embodiment of the disclosure. Referring to FIG. 6, the difference between a pixel array substrate 12 of this embodiment and the pixel array substrate 10 of FIG. 4 is that the electrode connection manner of the sensor is different. Specifically, a first electrode 211B of a sensor 210B of the pixel array substrate 12 penetrates through the interlayer insulating layer 140 to be electrically connected to the fifth signal line SL5. A second electrode 213B of the sensor 210B penetrates through the first planarization layer 150 and is electrically connected to the source S of the first active device T1.

Figure 7:
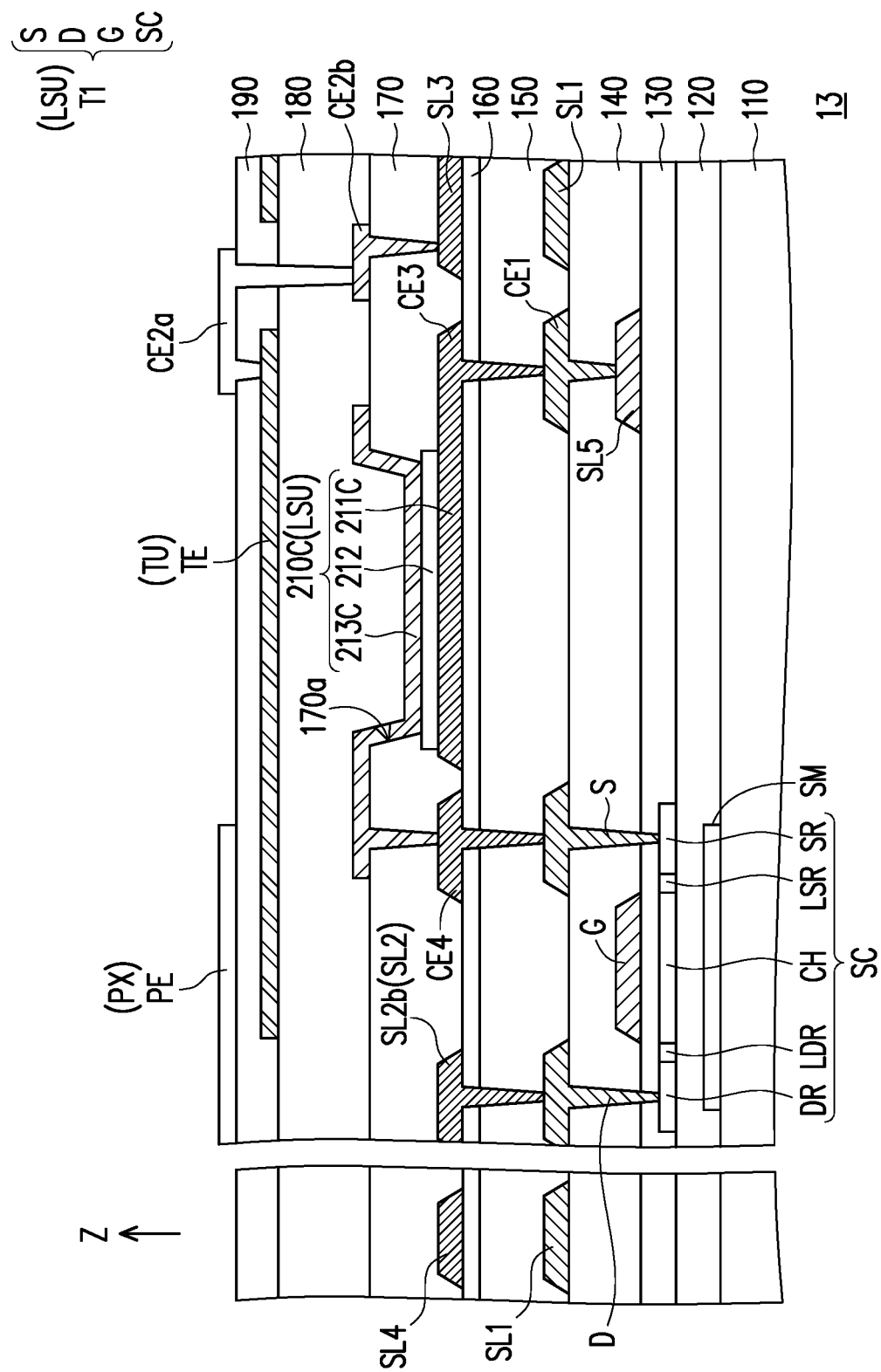
FIG. 7 is a schematic cross-sectional view of a pixel array substrate according to still another embodiment of the disclosure.

FIG. 7 is a schematic cross-sectional view of a pixel array substrate according to still another embodiment of the disclosure. Referring to FIG. 7, the difference between a pixel array substrate 13 of this embodiment and the pixel array substrate 11 of FIG. 5 is that the electrode connection manner of the sensor is different. Specifically, a first electrode 211C of a sensor 210C of the pixel array substrate 13 is electrically connected to the fifth signal line SL5 directly through a connection electrode CE3, and a second electrode 213C of the sensor 210C is electrically connected to the source S of the first active device T1. In this embodiment, the pixel array substrate 13 may further include a connection electrode CE4 disposed between the insulating layer 160 and the second planarization layer 170, and the second electrode 213C of the sensor 210C is electrically connected to the source S of the first active device T1 through the connection electrode CE4.

In summary of the foregoing, in the pixel array substrate according to an embodiment of the disclosure, the plurality of pixel structures configured for displaying and the plurality of first signal lines are alternately arranged on the substrate along a direction. The light sensing units configured for optical sensing and the plurality of second signal lines are also alternately arranged on the substrate along the direction. Through symmetrically disposing any adjacent two of the light sensing units with respect to one of the second signal lines, and electrically connecting the same, the layout space available for circuit configuration can be increased, which facilitates simplification of the manufacturing process of the pixel array substrate and reduction of production costs thereof.

What is claimed is:

1. A pixel array substrate, comprising:
   a substrate;
   a plurality of first signal lines arranged on the substrate along a first direction;
   a plurality of pixel structures disposed between the first signal lines;
   a plurality of second signal lines arranged on the substrate along the first direction;
   a plurality of light sensing units disposed between the second signal lines, and electrically connected to the second signal lines, any adjacent two of the light sensing units symmetrically disposed with respect to one of the second signal lines;
   a plurality of third signal lines, the third signal lines and the second signal lines alternately arranged on the substrate; and
   a plurality of touch units electrically connected to the third signal lines.

2. The pixel array substrate as described in claim 1, wherein the light sensing units comprise a first light sensing unit, a second light sensing unit, and a third light sensing unit adjacent to each other, one of the second signal lines is provided between the first light sensing unit and the second light sensing unit, another one of the second signal lines is provided between the second light sensing unit and the third light sensing unit, the one of the second signal lines is electrically connected to the first light sensing unit and the second light sensing unit, and the another one of the second signal lines electrically is connected to the second light sensing unit and the third light sensing unit.

3. The pixel array substrate as described in claim 1, wherein the light sensing units each comprise:
   a sensor;
   a first active device electrically connected to and between the sensor and one of the second signal lines; and
   a second active device electrically connected to and between the sensor and another one of the second signal lines.

4. The pixel array substrate as described in claim 3, further comprising:
   a plurality of fourth signal lines, the fourth signal lines and the second signal lines alternately arranged on the substrate, wherein the second active devices of the light sensing units are electrically connected to the fourth signal lines.

5. The pixel array substrate as described in claim 4, wherein the second signal lines, the third signal lines, and the fourth signal lines belong to a same film layer and overlap the first signal lines.

6. The pixel array substrate as described in claim 3, further comprising an insulating layer covering the sensors of the light sensing units, the second signal lines and the third signal lines disposed on the insulating layer, wherein the sensors each comprise:
   a first electrode, the first electrode, and a source and a drain of the first active device belonging to a same film layer, and the first electrode electrically connected to the source of the first active device;
   a second electrode disposed overlapping the first electrode; and
   a sensing layer sandwiched between the first electrode and the second electrode.

7. The pixel array substrate as described in claim 3, further comprising:
   a planarization layer covering the first active device; and
   an insulating layer disposed on the planarization layer, the second signal lines and the third signal lines disposed on the insulating layer, wherein the sensor comprises a first electrode, a second electrode, and a sensing layer sandwiched between the first electrode and the second electrode, and the first electrode, the second signal lines, and the third signal lines belong to the same film layer.

8. The pixel array substrate as described in claim 3, further comprising:
   a planarization layer covering the first active device; and
   an insulating layer covering the planarization layer and the sensors of the light sensing units, the second signal lines and the third signal lines disposed on the insulating layer,
   wherein the sensor comprises a first electrode, a second electrode, and a sensing layer sandwiched between the first electrode and the second electrode, the planarization layer has an opening overlapping the sensing layer, the first electrode, and a source and a drain of the first active device belong to a same film layer, the second electrode partially covers the planarization layer and a portion of the sensing layer exposed through the opening, and the second electrode is electrically connected to the first active device.

9. The pixel array substrate as described in claim 3, further comprising:
a first planarization layer covering the first active device;
an insulating layer disposed on the first planarization layer, the second signal lines and the third signal lines disposed on the insulating layer; and
a second planarization layer disposed on the insulating layer and covering the second signal lines and the third signal lines,
wherein the sensor comprises a first electrode, a second electrode, and a sensing layer sandwiched between the first electrode and the second electrode, the second planarization layer has an opening overlapping the sensing layer, the first electrode, the second signal lines, and the third signal lines belong to a same film layer, the second electrode partially covers the second planarization layer and a portion of the sensing layer exposed through the opening, and the second electrode is electrically connected to the first active device.

10. The pixel array substrate as described in claim 1, wherein the second signal lines and the third signal lines belong to a same film layer and overlap the first signal lines.

11. A pixel array substrate, comprising:
a substrate;
a plurality of first signal lines arranged on the substrate along a first direction;
a plurality of pixel structures disposed between the first signal lines;
a plurality of second signal lines arranged on the substrate along the first direction;
a plurality of light sensing units disposed between the second signal lines, any adjacent two of the light sensing units electrically connected to one of the second signal lines;
a plurality of third signal lines, the third signal lines and the second signal lines alternately arranged on the substrate; and
a plurality of touch units electrically connected to the third signal lines.

12. The pixel array substrate as described in claim 1, wherein the light sensing units comprise a first light sensing unit, a second light sensing unit, and a third light sensing unit adjacent to each other, the first light sensing unit and the second light sensing unit are symmetrically disposed with respect to one of the second signal lines, and the second light sensing unit and the third light sensing unit are symmetrically disposed with respect to another one of the second signal lines.

13. The pixel array substrate as described in claim 11, wherein the light sensing units each comprise:
a sensor;
a first active device electrically connected to and between the sensor and one of the second signal lines; and
a second active device electrically connected to and between the sensor and another one of the second signal lines.

14. The pixel array substrate as described in claim 13, further comprising:
a plurality of fourth signal lines, the fourth signal lines and the second signal lines alternately arranged on the substrate, wherein the second active devices of the light sensing units are electrically connected to the fourth signal lines.

15. The pixel array substrate as described in claim 14, wherein the second signal lines, the third signal lines, and the fourth signal lines belong to a same film layer and overlap the first signal lines.

16. The pixel array substrate as described in claim 13, further comprising an insulating layer covering the sensors of the light sensing units, the second signal lines and the third signal lines disposed on the insulating layer, wherein the sensors each comprise:
a first electrode, the first electrode, and a source and a drain of the first active device belonging to a same film layer, and the first electrode electrically connected to the source of the first active device;
a second electrode disposed overlapping the first electrode; and
a sensing layer sandwiched between the first electrode and the second electrode.

17. The pixel array substrate as described in claim 13, further comprising:
a planarization layer covering the first active device; and
an insulating layer disposed on the planarization layer, the second signal lines and the third signal lines disposed on the insulating layer, wherein the sensor comprises a first electrode, a second electrode, and a sensing layer sandwiched between the first electrode and the second electrode, and the first electrode, the second signal lines, and the third signal lines belong to the same film layer.

18. The pixel array substrate as described in claim 13, further comprising:
a planarization layer covering the first active device; and
an insulating layer covering the planarization layer and the sensors of the light sensing units, the second signal lines and the third signal lines disposed on the insulating layer,
wherein the sensor comprises a first electrode, a second electrode, and a sensing layer sandwiched between the first electrode and the second electrode, the planarization layer has an opening overlapping the sensing layer, the first electrode, and a source and a drain of the first active device belong to a same film layer, the second electrode partially covers the planarization layer and a portion of the sensing layer exposed through the opening, and the second electrode is electrically connected to the first active device.

19. The pixel array substrate as described in claim 13, further comprising:
a first planarization layer covering the first active device;
an insulating layer disposed on the first planarization layer, the second signal lines and the third signal lines disposed on the insulating layer; and
a second planarization layer disposed on the insulating layer and covering the second signal lines and the third signal lines,
wherein the sensor comprises a first electrode, a second electrode, and a sensing layer sandwiched between the first electrode and the second electrode, the second planarization layer has an opening overlapping the sensing layer, the first electrode, the second signal lines, and the third signal lines belong to a same film layer, the second electrode partially covers the second planarization layer and a portion of the sensing layer exposed through the opening, and the second electrode is electrically connected to the first active device.

20. The pixel array substrate as described in claim 11, wherein the second signal lines and the third signal lines belong to a same film layer and overlap the first signal lines.

* * * * *